US011715295B2

(12) United States Patent
Tamazato

(10) Patent No.: US 11,715,295 B2
(45) Date of Patent: Aug. 1, 2023

(54) CONSTRUCTION FIELD MANAGEMENT EQUIPMENT AND CONSTRUCTION FIELD MANAGING METHOD

(71) Applicant: TOTALMASTERS CO., LTD., Kuwana (JP)

(72) Inventor: Yoshinao Tamazato, Kuwana (JP)

(73) Assignee: TOTALMASTERS CO., LTD., Kuwana (JP)

( * ) Notice: Subject to any disclaimer, the term of this patent is extended or adjusted under 35 U.S.C. 154(b) by 187 days.

(21) Appl. No.: 17/132,977

(22) Filed: Dec. 23, 2020

(65) Prior Publication Data

US 2021/0294931 A1 Sep. 23, 2021

(30) Foreign Application Priority Data

Mar. 19, 2020 (JP) ................. 2020-050002

(51) Int. Cl.
*G06F 30/13* (2020.01)
*G06V 20/13* (2022.01)
(Continued)

(52) U.S. Cl.
CPC ............ *G06V 20/13* (2022.01); *B64C 39/024* (2013.01); *G06F 30/13* (2020.01); *G06V 20/17* (2022.01);
(Continued)

(58) Field of Classification Search
CPC ....... G06F 30/00; G06F 30/13; B64C 39/024; B64C 2201/123; G06V 20/13; G06V 20/17; H04W 4/029; G01C 21/3826; G01C 21/3852; G05D 1/0236; G05D 1/0214; G05D 1/0221; G05D 1/024; G05D 1/0251;
(Continued)

(56) References Cited

U.S. PATENT DOCUMENTS

2020/0005656 A1* 1/2020 Saunamaeki ........ G08G 5/0043

FOREIGN PATENT DOCUMENTS

CN 110888957 A * 3/2020 ............ G06F 16/29
JP H06-028030 A 2/1994
(Continued)

OTHER PUBLICATIONS

Kim, Pileun et al., "UAV-Assisted Autonomous Mobile Robot Navigation for As-Is 3D Data Collection and Registration in Cluttered Environments", Jul. 26, 2019, Automation in Construction 106, Elsevier B.V. (Year: 2019).*
(Continued)

*Primary Examiner* — Cedric Johnson
(74) *Attorney, Agent, or Firm* — Oliff PLC

(57) ABSTRACT

A construction field management apparatus is wirelessly connected to a remote control vehicle with a surveying device for positioning the vehicle itself, a travel route is specified based on the position information in the coordinate system set in the work field, and a travel instruction based on the travel route, an instruction of performance of a predetermined function with the traveling, and are transmitted to the remote control vehicle, and the apparatus receives data based on the execution of the predetermined function from the remote control vehicle, and the construction field is managed by the construction field management apparatus for managing based on the received data.

7 Claims, 4 Drawing Sheets

(51) Int. Cl.
*H04W 4/029* (2018.01)
*B64C 39/02* (2023.01)
*G06V 20/17* (2022.01)
*B64U 101/30* (2023.01)

(52) U.S. Cl.
CPC ......... *H04W 4/029* (2018.02); *B64U 2101/30* (2023.01)

(58) Field of Classification Search
CPC .. G05D 1/0257; G05D 1/0276; G05D 1/0278; G05D 1/101; G05D 2201/02; G06D 1/0221; H06L 67/12; H04L 67/12; H04N 7/181; B64U 2201/30
USPC ............................................................ 703/1
See application file for complete search history.

(56) References Cited

FOREIGN PATENT DOCUMENTS

| | | |
|---|---|---|
| JP | H11-126211 A | 5/1999 |
| JP | 2005-269413 A | 9/2005 |
| JP | 2013-002161 A | 1/2013 |
| JP | 2015/076420 A | 4/2015 |
| JP | 2016-058767 A | 4/2016 |
| JP | 2016-132912 A | 7/2016 |
| JP | 2016-225983 A | 12/2016 |
| JP | 2017-013653 A | 1/2017 |
| JP | 2017-068869 A | 4/2017 |
| JP | 2019-056562 A | 4/2019 |
| JP | 2019-169016 A | 10/2019 |
| JP | 2019-206865 A | 12/2019 |
| JP | 2020-021403 A | 2/2020 |
| JP | 7040809 B2 | 3/2022 |
| KR | 10-2019-0134237 A | 12/2019 |

OTHER PUBLICATIONS

Kim, P. et al., "As-Is Geometric Data Collection and 3D Visualization Through the Collaboration Between UAV and UGV", Jul. 27, 2019, 36th International Symposium on Automation and Robotics in Construction (ISARC 2019). (Year: 2019).*
Sep. 13, 2021 Decision of Refusal issued in Japanese Patent Application No. 2020-050002.
Dec. 23, 2020 Office Action issued in Japanese Patent Application No. 2020-050002.
English translation of allowed claims in Japanese Patent Application No. 2020-050002.
Sep. 13, 2021 Decision of Dismissal of Amendment issued in Japanese Patent Application No. 2020-050002.
Aug. 25, 2020 Office Action issued in Japanese Patent Application No. 2020-050002.
Response to Aug. 25, 2020 Office Action issued in Japanese Patent Application No. 2020-050002.

* cited by examiner

[Fig. 1]
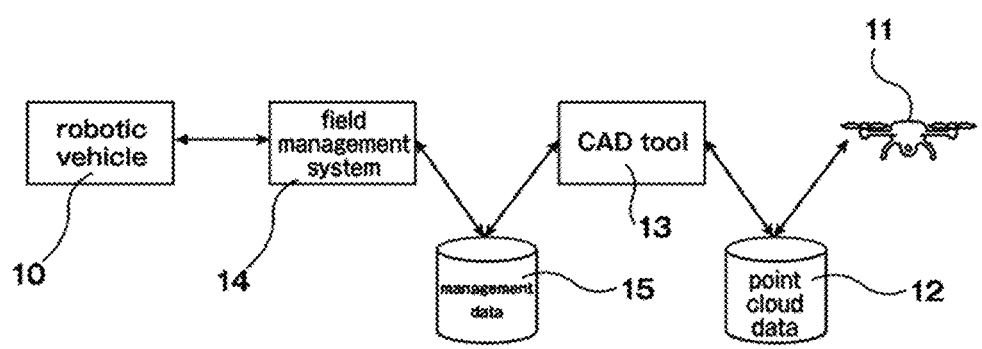

[Fig. 2]
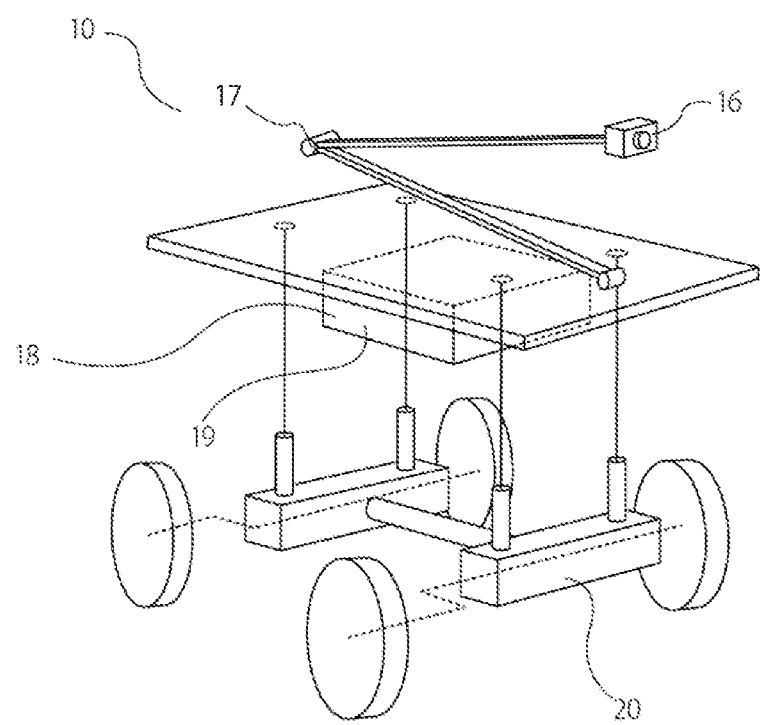

[Fig. 3]
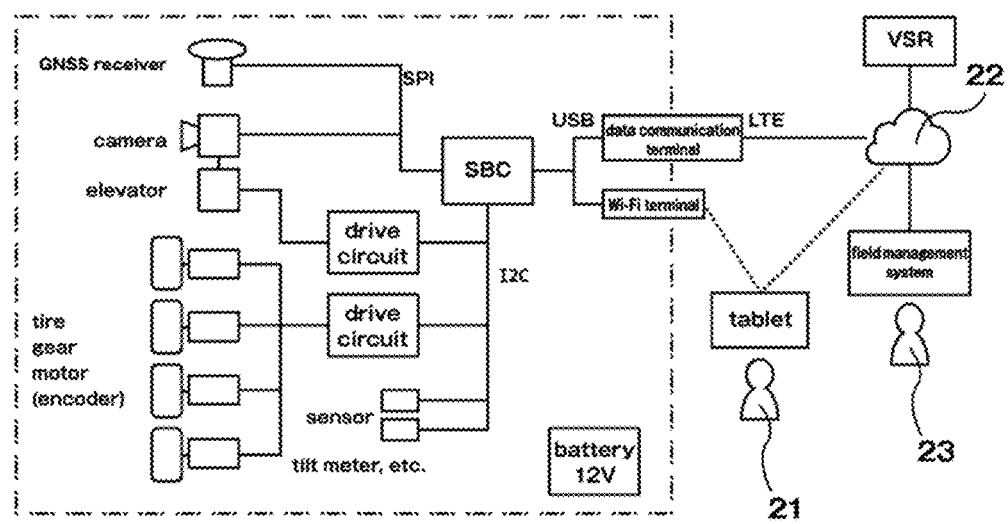

[Fig. 4]
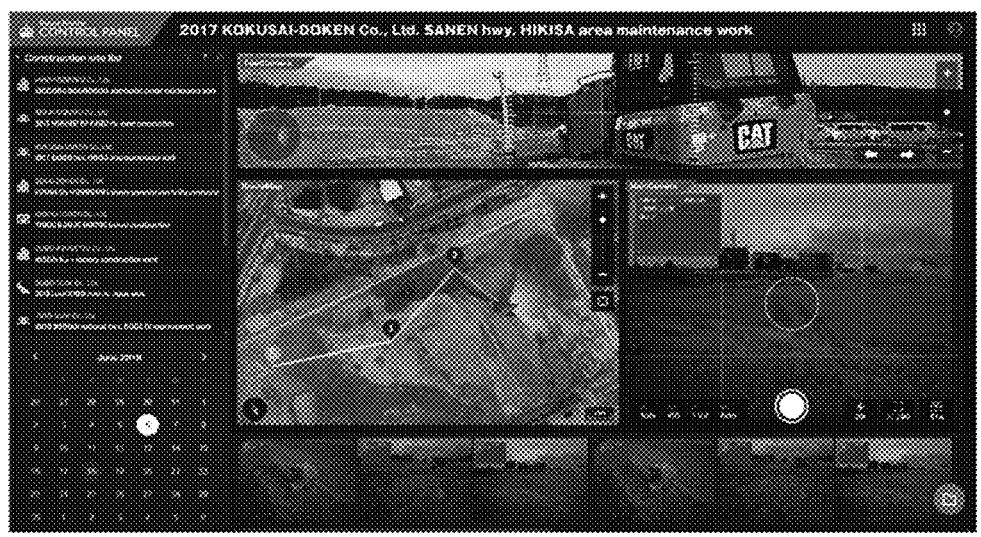

CONSTRUCTION FIELD MANAGEMENT EQUIPMENT AND CONSTRUCTION FIELD MANAGING METHOD

TECHNICAL FIELD

The present invention relates to a construction record photograph and a construction recording method used for recording the situation of the construction field, and especially, the invention relates to a construction field management equipment using an automatic robot and its system.

BACKGROUND

Traditionally, photography recording is carried out at construction fields to confirm that works have been carried out properly. At this time, it is common for photographs to include black boards containing information such as construction objects, construction names, dates, constructors, etc. in the workings, etc., and scales (measures) for representing the sizes of the objects.

However, performing the photographing under the instruction of the blackboard or scale in this way was a troublesome and time-consuming complicated work. In addition, after completion of the construction, the contents of the black board shown in the photograph must be read and written on a report. Further, it was labor-requiring to carry blackboards, etc. and to hold them during photographing. In order to solve such problems, various technical examinations have been conventionally made, and various proposals have been made by the prior literature as listed below.

For example, Patent Document 1 discloses a technical idea that an aerial photographing system utilizes an unmanned aerial vehicle, which vehicle is adapted to photograph an object to be photographed such as a building or a predetermined location from the air, and comprises an autonomous control device for stably autonomous flights of the unmanned aerial vehicle, a photographing camera for photographing the object to be photographed, a route guidance camera for guiding a vehicle flight route, so that the unmanned aerial vehicle is flied to the position of the object to be photographed and the object to the position of the photograph object, and photographing flight is performed from the sky of the object, a flight program for flying the unmanned aerial vehicle in a predetermined flight route, and a storage unit for storing a photographing program, which is adapted to photograph the object along the flight route with the photographing camera by a specified photographing technique. This system is characterized in that the unmanned aerial vehicle is automatically flied along the predetermined route based on image information photographed with the route guidance camera and the flight program, the object is automatically photographed according to the photographing program. The technical idea of the aerial photographing system utilizing the unmanned aerial vehicle is disclosed.

However, this example is limited to the aerial photographing of ground objects using unmanned aerial vehicles, but no reference is made to matching with construction management systems at construction fields, etc. In addition, it has not yet come to present a solution to the problem of economical efficiency in the construction field management.

Patent Document 2 discloses a technical idea of a construction recording program, which is used to record the situation of the construction field and is characterized in that it makes a portable terminal which comprises a photographing unit for photographing the object in the construction, a display unit for displaying an image photographed by the photographing unit and an input unit for receiving an operation input, perform a construction information input receiving step for accepting the input of information about the construction, a photographing step for acquiring an image by photographing an object by the photographing unit and displaying it on the display unit, in response to the operation input to the input unit, a marker detection step for detecting whether AR marker is present in the image, a calculation step for calculating the position and the posture of the AR marker when it is present, and a scale display step for displaying on the said display unit by superimposing a scale on the said image according to the position and posture of the said AR marker.

However, this example merely relates to a technical idea that a worker or other person who carried portable terminal equipment, etc. with a program for construction recording at a construction field, makes photographing, etc. by moving around the construction field successively.

PRIOR ART DOCUMENTS

Patent Documents

[Patent Document 1] JP-A-2005-269413
[Patent Document 2] JP-A-2020-21403

SUMMARY OF THE INVENTION

Problems to be Solved by the Invention

The working progress in preparation sites mentioned above is mostly grasped personally. For example, a construction record photographing is an inefficient work in which a full-time technician gets off a car and takes pictures from a car from time to time. However, the recording photograph has prescribed rules for objects to be photographed and how to photograph them, so that a full-time person is required. Despite the constant fear in human resource depletion, such as labor shortage, due to the aging problem, recorded photographs cannot be removed because they are an essential requirement for construction works. On the other hand, the efficiency has been improved by several construction apps such as for superimposing electronic blackboards and making photographed pictures clouding. However, the objects to be photographed and photographing ways still belong persons.

Against the above problems, an object of the present invention is that a conventional full-time worker manages multiple preparation sites from a remote office through a robotic vehicle in the field, and the construction photographs are taken according to his or her expertise. Then, grasping the progress delay of the site, discovering the left of dangerous materials, and discovering the possibility of contact between workers and construction equipment, etc., which are handled personally, are handled by monitoring with moving vehicles through incorporating these rules and prior knowledge.

For example, in the case of a car that travels automatically, autonomous traveling cars can travel a road that has been learned by pre-learning in which a person directly maneuvers a vehicle or robot to learn the road in advance, They can also additionally given with handling such as detecting and stopping obstacles, or avoiding passing them in the best way. These can also be set by CAD as in the present application.

In the recent technique, a method in which a place and a route through which the car moves are recognized through estimating the self-position, while performing spatial sensing and making space map, i.e., the method (Simultaneous Localization and Mapping) by SLAM, etc. also exist. However, SLAM is a sophisticated and highly adaptive method, it is necessary to move around by trial and error. Therefore, there are cases where it is unsuitable for an uncertain location of traveling availability, such as a reclaimed land.

However, the present invention assumes that the geography of the terrain concerned and the travel routes for management are appropriately set in advance, so that the robotic vehicle should move definitely. The present invention is aimed at effectively avoiding the conventional problems as described above.

That is, a specific object of the present invention automatically manages the construction working progress at a given location in a preparation working site, and especially, construction recording photographs are desired to be taken by an automatic control system. That is to say, it is to carry out management using a robotic vehicle which autonomously moves the place in concern. For moving vehicles, the introduction of advanced autonomous driving cars, such as overcoming obstacles by themselves, can be avoided. Namely, since the location is surveyed and its topography is grasped, the movement route and a movement destination as the route termination for a given management can be specified in advance. And, the present position of the robotic vehicle can be grasped by satellite positioning, etc. It is the object of the invention that the desired traveling control can be realized by moving the vehicle along a given route based on the position of the car itself grasped by satellite positioning, etc.

Moving vehicles are especially intended for movement where a landform such as a developed land is grasped beforehand and a route suitable for traveling is prepared. The topography can be grasped in detail by UAV survey (unmanned aerial surveying) typically. Travel path is assigned is typically based on a three-dimensional CAD tool using UAV surveying data. A moving destination is, in particular, sites where construction recording photographs are taken, and at the photographing point, the position of the robotic vehicle may be adjusted, so that the angle is suitable for photographing.

The present invention is intended to solve such prior art problems, and its object is to provide a construction field management system capable of significantly enhancing economic efficiency while significantly improving the safety and workability in construction fields.

[Measures for Solving the Problem]

(1) To solve such problems, the construction field management apparatus according to the present invention is wirelessly connected to a remote control vehicle for moving with a surveying device installed thereon for positioning the position of the remote control vehicle itself, said construction field management apparatus being adapted to set a traveling route for said remote control vehicle in advance in a working field based on position information in a coordinate system set for the working field, to transmit, to said remote control vehicle, the traveling route, a traveling instruction based on the traveling route, and an instruction for performing a predetermined function with traveling, to receive data from said remote control vehicle, which data are obtained through grasping the position of the remote control vehicle itself surveyed with the surveying device, traveling along near a vicinity of the traveling route and performing said predetermined function, and to manage the construction field based on said received data.

(2) Further, the traveling route in the construction field management apparatus according to the present invention, is also characterized in that it is a travelling route preset by a point sequence of point cloud data on a ground surface of the working site created based on the coordinates of the UAV (unmanned aerial vehicle) survey and the World Geodetic System. In other words, it is a travel route preset by a point sequence of point cloud data on a ground surface of a working site created based on the coordinates of the UAV (unmanned aerial vehicle) survey and the World Geodetic System, the remote control vehicle is further equipped with a photographing device, by receiving photographing data by the photographing device from the remote control vehicle, so that it is also possible to confirm the photographed image during travelling on the traveling route and on stoppage of the traveling.

(3) The present invention further provides a remote control vehicle, and said remote control device mounts a photographing device thereon and one of said predetermined function is to photograph with the photographing device, and the construction field management apparatus receives photographed data from the remote control vehicle, confirm photographed images photographed when traveling and stops on the travelling route, and record and store them as photographing data which are made consistent with a working type, a classified type, and a sub-division working type and a file rule management item specified in a predefined photo management information standard.

That is, the construction field management apparatus according to the present invention may be a construction field control system interlocking with whole construction working management system which includes, for example, a survey device for measuring a world geodetic system position, a positionally movable photographing device for photographing a working site, a remote moving vehicle mounting the photographing device, and a control unit for controlling the remote control vehicle and remote control device for controlling photographing by the remote control vehicle and the photographing with the photographing device. According to the instruction from the construction field management apparatus, the remote control vehicle travels on the travel route designated based on the position information in the coordinate system set in the working site, while confirming the present position of the vehicle surveyed by the surveying device, and perform image photographing with the photographing device, so that the construction field management apparatus receives and analyzes the information of the construction field via the photographed image with the photographing device, thereby providing the management of the construction field.

(4) The construction field management apparatus according to the present invention can create a topographic three-dimensional survey data further by recognizing the ground photographed image in the vicinity of the traveling route with the remote control vehicle.

(5) The remote control vehicle further comprises a scattering type RI (radioisotope) instrument, and one of said predetermined functions is the measurement of radiation dose with RI, The ground density and the underground water content can also be measured by receiving data from the RI instrument from the remote control vehicle, so that the surface compaction degree distribution data can be prepared.

(6) Then, the remote control vehicle is further equipped with a UAV (unmanned aerial vehicle), one of the predetermined functions being to issue a transport traveling and flight instruction for the UAV, and can perform aerial surveying and photographing by receiving the photographing data taken with the UAV from the remote control vehicle.

(7) Further, a user interface accompanies the construction field management apparatus according to the present invention, a display screen of the user interface is composed of an overlooking image from the remote control vehicle and/or the traveling path displayed in the field overlooking view and/or an information display relating to the predetermined function to be performed with the traveling, the interface instructs for traveling along the traveling path shown in the site overlooking view and performing the predetermined function, and the interface stores the information generated with the performance of the predetermined function or displays the accumulated information.

(8) In addition, the construction field management apparatus according to the present invention involves the following remote control vehicle as its technical idea.

The remote control vehicle receives instructions remotely from the construction field management apparatus to which the vehicle is wirelessly communicatively connected, is equipped with a surveying device for positioning the position of the vehicle itself, a photographing device for photographing, wheels, a motor, a battery, and various sensors, can unmannedly and autonomously travel on the working site by the remote operation, receives, from the construction field management apparatus, the traveling route on which the vehicle travels and the instruction for traveling based on the traveling route, and travels along in the vicinity of the traveling route based on its own position positioned by the surveying devices, and said remote control vehicle comprises a functional device having a predetermined function to be performed in conjunction with the traveling, receives an instruction to perform the predetermined function from the construction field management apparatus, and performs the predetermined functions with traveling.

(
(0025X)
(9) The present invention also provides a construction field management method, said construction field management method comprising steps of
  using a remote control vehicle and a construction, said remote control vehicle mounting a surveying device thereon for positioning the position of the remote control vehicle and being adapted to travel and perform a predetermined function, and said construction field management apparatus being wirelessly communicatively connected to the remote control vehicle,
  setting a traveling route in advance for the remote control vehicle in a working site based on position information in the coordinate system set in the working site,
  transmitting, from said construction field management apparatus to said remote control vehicle, said traveling route, an instruction for traveling based on the traveling route, and an instruction for performing the predetermined function with the traveling,
  the remote control vehicle traveling along in the vicinity of the traveling route based on the position of the remote control vehicle itself positioned by the surveying device,
  transmitting to the construction field managing apparatus, data obtained by performing the predetermined function, and
  an the construction field management apparatus performing management of the construction field based said received data.

Meanwhile, nothing is denied about displaying other necessary information on the display screen as the user interface. Further, the display screen which is a user interface of the construction field management apparatus by the remote control vehicle according to the present invention is not intended to limit the above essential items as display contents only. Further, the controller of the construction field management apparatus according to the present invention controls the surveying apparatus and/or the remote control vehicle and/or the photographing device and/or the scattering type RI and/or the UAV based on the instructions of the construction field management apparatus.

The present invention is not limited to the above-described embodiments, and various modifications can be made without departing from the scope of the present invention. It is claimed that all of them are part of this technical idea, including the equivalence doctrine-correspondence countermeasures related to the above-mentioned embodiments.

Effect of the Invention

According to the present invention, the field management conventionally performed personally can be systemized, especially, a great effect is exhibited in photographing the construction recording photographs. In addition, specialists who were conventionally assigned to the site are located in remote offices by making the system online (clouding), so that management is simultaneously performed over plural sites, utilizing expertise, thereby saving labor and improving work efficiency can be achieved. In addition, according to the present invention, since the ground surface, the moving path, etc. in the construction field can be prepared at a stage of designing the site with a design tool relating to the ground surface of the target site. The remotely traveling vehicle used in the site management can travel by giving the predetermined path to it, without requiring the vehicle itself to learn the movement route. And, even when the ground surface of the traveling path changes, the vehicle can be faithfully traveled by giving a route matching the change as appropriate. Data for setting travel routes can be obtained simply and accurately according to the situation of the target site by UAV surveying.

According to the present invention, a specialist manages plural preparation sites from a remote office through a robotic vehicle, and takes photographs of construction work according to his or her expertise. In addition, grasping the progress delay of the site, discovering neglect of dangerous materials, discovering contact possibility between workers and construction apparatus, etc., which have traditionally been handled personally, can be handled through observation with the movement vehicle by incorporating their rules and prior knowledge and systematically grasping them. By systematically grasping them by incorporating their laws and prior knowledge, it becomes possible to handle them by monitoring by moving vehicles. Then, it becomes possible to provide a construction field management system capable of remarkably improving economic efficiency, while remarkably improving the safety and workability of the construction field.

BRIEF DESCRIPTION OF THE DRAWINGS

FIG. 1 is a conceptual scheme showing an entire image of a construction field management apparatus with a remote control vehicle according to an embodiment of the present invention.

FIG. 2 is a conceptual figure showing an image of a remote control vehicle of the construction field management apparatus with the remote control vehicle according to the embodiment of the present invention.

FIG. 3 is a functional block diagram of a control system of the remote control vehicle of the construction field management apparatus with the remote control vehicle according to an embodiment of the present invention.

FIG. 4 is a photographic diagram showing an example of an interface of the remote control vehicle of the construction field management apparatus with the remote control vehicle according to an embodiment of the present invention.

EXPLANATION OF SYMBOLS

10—remotely controlled vehicles (robotic vehicles), 11—UAV surveying (unmanned aerial surveying), 12—point cloud data, 13—CAD tool, 14—site management system, 15—management data, 16—photography Device (camera), 17—elevator lift, 18—battery, 19—control PC, 20—motor gear, 21—evaluator at the site, 22—cloud, 23—center expert

EMBODIMENTS FOR CARRYING OUT THE INVENTION

Hereinafter, explanation will be given on embodiments of the present invention with reference to the drawings. Incidentally, the following schematically shows the range necessary for explanation for achieving the object of the present invention, and mainly explains such a range as necessary for description of the corresponding portion of the present invention, while portions omitted shall belong to the known art.

FIG. 1 is a conceptual scheme showing an overall image of a construction field management apparatus with a remote control vehicle according to an embodiment of the present invention. As shown in the figure, the remote control vehicle (robotic vehicle) 10 is operated and controlled by the field management system (construction field management system) 14. Ground surface point group data 12 of a preparation site surveyed by an unmanned aerial vehicle (UAV: Unmanned aerial vehicle) 11 is accumulated in a management data 15 via a CAD tool 13, for example, as a traveling route.

As shown in FIG. 1, for example, as an exchange with the field management system 14, from the management data 15, the construction field information (name, location, construction time period, construction manager, etc.), operator information (name, ID, etc.), the working daily report (site, operator, work history) and the like information is provided.

Similarly, as shown in FIG. 1, as the field management system, a recording photo ledger (photographing history at the site), recorded photograph data (electronic black board, metadata with position information, etc.) or the like is created and stored as management data.

As shown in FIG. 1, the CAD tool 13 provides information such as a construction field overhead view (orthographic image or map, with the world geodetic system), a robotic (remotely traveling vehicle) traveling path (a predetermined movement path given by a point sequence in world geodetic systems), and photographic location information (a point in the world geodetic system, and a photographing direction).

FIG. 2 is a conceptual view showing an image of a remote control vehicle of the construction field management apparatus with the remote control vehicle according to an embodiment of the present invention. As shown in the figure, the remote control vehicle 10 includes a photographing device (camera) 16, an elevator lift 17, and a battery 18 a control PC19, a motor gear 20, a tires (wheels) and the like as a traveling mechanism, for example. In other words, it may be a vehicle that enables remote traveling.

Although omitted in FIG. 2, needless to say, the sensing sensor function of such as a tilt sensor for detection of overturning, a temperature sensor for motor heating, needless to say, a function necessary for other traveling vehicles, may be provided.

FIG. 3 is a functional block diagram of a control system of the remote control vehicle of the construction field management apparatus with the remote control vehicle according to an embodiment of the present invention. The control system of the remote control vehicle of the construction field management system constitutes functions as shown in the figure. SBC(Single Board Computer) means a computer Raspberry Pi or the like which operates by a substrate alone, etc.

That is, the SBC is a small computer on which control function element such as a CPU (Central Processing Unit) and a MPU (Micro-Processing Unit), a working memories (main memory), input/output terminals, and input/output processing function elements are mounted on a single board. The I/O processing function element is also referred to as chipset. In particular, it is used to control a device connected to the input and output terminals. In this case, it is connected to SPI and I2C.

SPI (Serial Peripheral Interface) is a standard and interface for performing data communication, by synchronous serial communication using a communication synchronous clock, to a device selected by a communication target selection signal, between a devices connected to the input-output terminal and the CPU or MPU.

I2C (Inter-Integrated Circuit), a standard and interface for performing data communication by synchronous serial communication using a communication synchronous clock, between a device connected to the input/output terminal and the CPU or MPU and the input-output terminals. The communication target device is also identified and communicated using the same communication. Both are of a serial communication system.

VRS (Virtual Reference Station) is a kind of reference stations installed to enhance the positional accuracy of GNSS receiver, and the reference station is installed in a known coordinate, and by grasping differential information between GNSS positioning at the reference station and the known coordinate and providing the differential information to GNSS receiver, the GNSS receiver can enhance the positioning accuracy by using the differential information. The reference station is referred to as a general RTK (Real-Time Kinematic) station, of which one that provides information to GNSS, particularly via a network, is referred to as VRS.

Next, a description will be given of the overall flow of the traveling control of the remote control vehicle of the construction field management apparatus with the remote control vehicle according to an embodiment of the present invention.

1. Ground surface point group data (PCD: Point Cloud Data) are created by UAV surveying.

2. Take the point cloud data into CAD tool (ex. AutoCAD), and make construction designing. This determines points for photographing construction record photographs. Then, determine vehicle traveling routes between the photographing points. The routes within a climbing slope limit without obstacles will be decided.

3. Output data for vehicle movement (traveling) from CAD. The outputs may be orthographic images of a construction field and its coordinate information or point cloud data of the construction field. An orthographic image is a distortion-free image that overlooks at the ground surface from the air, any point of the image is an image that overlooked at overhead from its zenith, and there is no viewing angle from an oblique direction. Similarly, the point sequence of the path which is the point group data of the moving path (traveling route) is also output.

4. Receive and manage the above data at the vehicle control interface (field management system).

5. For a vehicle at a certain point, specify a movement route (traveling route) with that point as and end point, and instruct the vehicle to move (travel) to the other end point.

6. The vehicle that has received the movement (traveling) instruction grasps the position of the vehicle itself by GNSS positioning, and proceeds along the vicinity of the movement route (traveling route) based on that position. Positioning may be made by a plurality of Wi-Fi base stations. When the target endpoint is reached, the movement completion is reported to the vehicle control interface.

7. In the vehicle control interface, an image is received from a camera mounted on a vehicle, and a subject of the construction record photograph is confirmed. Confirm the angle of view with respect to the subject, and if the angle of view is deviated, instruct the vehicle to move (travel) so as to match the desired angle of view.

The vehicle moves and adjusts its position according to the instructions.

8. When the subject and its angle of view are confirmed, the vehicle is instructed to take a photograph from the vehicle control interface.

9. The photographed image is received, and the electronic blackboard information is superimposed, and it is saved as a construction record photograph. Management information standards for managing photographs are defined by the MLIT as standard specifications for submission of photographs via electronic media.

The above is the overall flow of the travel control of the remote control vehicle for the construction field management apparatus with the remote control vehicle according to the embodiment of the present invention, and from the above 5, the operation is repeated.

Next, in the overall flow of the traveling control of the remote control vehicle of the construction field management apparatus by the remote control vehicle according to an embodiment of the present invention, a description will be given to the countermeasure to the change.

When a developing surface changes according to the construction progress, resurveying with UAV is performed as appropriate to update the ground surface point cloud data. The travel path is also updated based on the updated data. When it is necessary to change the travel route due to effect of the installed objects, etc. at the preparation site, it is sufficient to set the travel route again on the CAD tool. They may be fed to the vehicle control interface as appropriate, and traveling of the remote control vehicle is remotely controlled on updated routes to the vehicle.

When the vehicle falls over due to an obstacle or becomes immobile, this is communicated to the vehicle control interface. From the vehicle control interface, it can be communicated to a field person in charge to return the vehicle to a position and attitude on site that the vehicle can move.

FIG. 4 is a photograph showing an example of the interface for the remote control vehicle in the construction field management apparatus with the remote control vehicle according to an embodiment of the present invention. This is an example of a screen interface. The upper part of the screen is a bird's-eye view image from the vehicle, for example, a monitor during traveling. The middle left of the screen shows the site overhead view and the travel route. The middle row right of the screen indicates the actual photographed image. The lower row shows the photographing history of the construction record photographs. This is an example of the basic items of the screen interface. It does not exclude anything else that should be indicated.

Further, as a modification, according to the construction field management apparatus with a remote control vehicle according to an embodiment of the present invention, a remote control vehicle as a robotic vehicle can make survey. The travel vehicle can move in the target area to three-dimensionalize the topography. For example, the target area is grasped from UAV surveying or existing maps, etc., and given to the robotic vehicle in advance. This does not specify any routes, but only a boundary or range.

Specifically, the topography is made three-dimensionalized in GNSS coordinates captured by the vehicle itself based on the its own movement. That is to say, the topography is made three-dimensionally based on the GNSS coordinates of the own car, while surveying the surroundings with Lidar. This makes it possible to obtain detailed three-dimensional survey data that cannot be obtained by UAV surveying. For example, even if there are plants and trees and the UAV captures only the top surface, detailed data on the ground can be obtained. Topography overhangs and bottlenecks enable us to grasp in detail topographical features that cannot be captured by UAV surveys from the sky.

In addition, it becomes possible to grasp the ground surface condition in detail in the designation of the target area. The ground surface image captured by the robot (remote control vehicle) is recognized with the image, and the ground surface state can be grasped from the traveling resistance and the traveling behavior in situ. For example, by judging whether the ground surface is dry, wet, or muddy and immobile, it is possible to judge whether the car can travel or whether construction (excavation, earth retaining, etc.) to handle earth and sand on site can be done on the site management system even if no one is on the site.

Further, in the construction field management system with the remote control vehicle according to an embodiment of the present invention, the radiation dose with RI (radioisotope) can be measured by using a scattering type RI instrument or the like as a modification.

This will enable us to grasp the more detailed ground structure for the target area designation. That is, while moving the target site, a predetermined search is performed for each predetermined point a as follows. For example, in the rolling compaction work for compaction of the developing land, management is made only by the number of rolling compaction works such as a roller rolling device, so it is not necessarily accurate compaction. The ground density and the underground moisture can be measured by measuring radiation dose with RI (radioisotope) with the scattering type RI instrument, etc., and compaction degree can be accurately grasped. Until now, the implementation was not realistic, because it was exclusively manual.

The remotely controlled vehicle robot may be equipped with a scattering type RI instrument to each measure underground RI around designated points, so that the degree of compaction can be grasped by effectively measuring the ground density and the underground water content. Accurate rolling compaction work can be done neither too much or too little by confirming the compaction degree.

Furthermore, in the construction field management apparatus with the remote control vehicle according to an embodiment of the present invention, as a modification, the UAV is transported, so that the UAV can also perform surveying or the like at a predetermined location. When the remote control vehicle robot works as a UAV base and moves to a predetermined location, the construction field management system can make the UAV take the necessary action.

For example, even if you want to perform the UAV observation or survey from a location where flight of UAVs is difficult, such as when there are flight restrictions on the target area, environmental conditions such as noise, or when there is a gusty area such as a riverbed where flight cannot be moved, it can be carried on the remote control vehicle up to a location where flight is possible, thereby enabling the intended operation. At the destination, it becomes possible to recognize the ground surface condition through surveying and image processing, and grasp the underground condition through remote sensing.

Illustration and description are omitted for elements that have the same structure as those of the above description and are not particularly required for the description of the present embodiment. However, both embodiments are within the scope of this technical idea.

The present invention is not limited to the embodiments described above, the present invention can be performed with various changes within the scope not departing from the scope of the present invention. All of them are part of this technology idea.

INDUSTRIAL APPLICABILITY

According to the present invention, a full-time person can manage multiple preparation sites from a remote office through a robotic vehicle and take a construction photograph according to his or her expertise. In addition, such as grasping the progress delay in the site, discovering the neglect of dangerous materials, and discovering the possibility of contact between workers and construction apparatus, which have traditionally been handled personally, can be handled through monitoring with the travel vehicle by systematically grasping them through observation with the travel vehicle by incorporating their rules and prior knowledge.

In addition, according to the present invention, it is possible to obtain detailed three-dimensional survey data, to obtain detailed data on the ground surface, to grasp the degree of compaction by the measurement of the ground density and the underground moisture, to move the difficult-to-photograph UAV remotely, etc.

Thus, according to the invention according to the present application, while significantly improving the safety and workability in the construction field, it is possible to provide the construction field management system capable of significantly improving economic efficiency, so that the remote management of the construction field is realized.

Accordingly, the present invention is applicable to all applications without being limited to construction fields. Therefore, this application brings great benefits to various industries besides the civil engineering and construction industry.

What is claimed is:

1. A construction field management apparatus wirelessly connected to a remote control vehicle in which a surveying device is installed, the surveying device being used for positioning a position of the remote control vehicle, the construction field management apparatus including a processor configured to:
    set a traveling route for the remote control vehicle in advance on a ground surface of a working field, with a three-dimensional Computer Aided Design (CAD) tool for the ground surface of the working field, based on position information in a coordinate system set for the working field,
    transmit, to the remote control vehicle, the traveling route for the remote control vehicle, a traveling instruction based on the traveling route, and an instruction for performing a predetermined function with traveling,
    receive data from the remote control vehicle, which data are obtained through performing the predetermined function by receiving the position of the remote control vehicle, surveyed with the surveying device, while the remote control vehicle is traveling along a vicinity of the traveling route based on the position,
    when a ground surface of the traveling route changes depending on a construction progress of the working field, transmit the traveling route updated in accordance with the change in the ground surface of the traveling route to the remote control vehicle, and/or update data of ground surface point cloud data obtained by resurveying with an unmanned aerial vehicle (UAV) and update the traveling route to be transmitted based on the updated data of the ground surface point cloud data, and
    repeatedly manage the working field based on the received data.

2. The construction field management apparatus set forth in claim 1, wherein the traveling route is a travelling route preset by a point sequence of point cloud data on the ground surface of the working field created based on resurveying of the UAV and coordinates of the World Geodetic System.

3. The construction field management apparatus set forth in claim 1, wherein:
    a photographing device is mounted on the remote control vehicle and the predetermined function is to photograph with the photographing device, and
    the processor of the construction field management apparatus receives photographed data from the remote control vehicle, confirms photographed images photographed when traveling and stopped on the travelling route, and records and stores the photographed images as photographing data.

4. The construction field management apparatus set forth in claim 1, wherein the processor of the construction field management apparatus creates a topographic three-dimensional survey data by using a ground surface photographed image in the vicinity of the traveling route with the remote control vehicle.

5. The construction field management apparatus set forth in claim 1, wherein the remote control vehicle further includes a scattering type RI (radioisotope) instrument, and the predetermined function is a measurement of radiation dose with the RI instrument, and
    the construction field management apparatus measures a ground density and an underground water content by receiving data from the RI instrument from the remote control vehicle, and prepares surface compaction degree distribution data.

6. The construction field management apparatus set forth in claim 1, wherein:

the remote control vehicle is further equipped with the UAV, and the predetermined function is to issue a transport traveling and flight instruction for the UAV, and the construction field management apparatus performs aerial surveying and photographing by receiving photographing data taken with the UAV from the remote control vehicle.

7. A construction field management method using a remote control vehicle in which a surveying device is installed and a construction field management apparatus, the surveying device configured to be used for positioning a position of the remote control vehicle, and the construction field management apparatus being wirelessly communicatively connected to the remote control vehicle, the construction field management method comprising:

setting a traveling route in advance for the remote control vehicle on a ground surface of a working field, with a three-dimensional Computer Aided Design (CAD) tool for the ground surface of the working field, based on position information in a coordinate system set for the working field, transmitting, from the construction field management apparatus to the remote control vehicle, the traveling route for the remote control vehicle, a traveling based on the traveling route, and an instruction for performing a predetermined function with traveling, the remote control vehicle traveling along a vicinity of the traveling route based on the position of the remote control vehicle positioned by the surveying device, and transmitting, to the construction field management apparatus, data obtained by performing the predetermined function, when a ground surface of the traveling route changes depending on a construction progress of the working field, transmitting the traveling route updated in accordance with the change in the ground surface to the remote vehicle, and/or updating data of ground surface point cloud data obtained by resurveying with an unmanned aerial vehicle (UAV) and updating the traveling route to be transmitted based on the updated data of the ground surface point cloud data, and repeatedly managing the working field based on the transmitted data.

* * * * *